(12) United States Patent
Suzuki et al.

(10) Patent No.: US 9,684,031 B2
(45) Date of Patent: Jun. 20, 2017

(54) CONTACT PROBE AND SEMICONDUCTOR ELEMENT SOCKET PROVIDED WITH SAME

(71) Applicant: YAMAICHI ELECTRONICS CO., LTD., Tokyo (JP)

(72) Inventors: Katsumi Suzuki, Tokyo (JP); Takeyuki Suzuki, Yokohama (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 14/416,692

(22) PCT Filed: May 23, 2013

(86) PCT No.: PCT/JP2013/064358
§ 371 (c)(1),
(2) Date: Jun. 30, 2015

(87) PCT Pub. No.: WO2014/017157
PCT Pub. Date: Jan. 30, 2014

(65) Prior Publication Data
US 2015/0369859 A1    Dec. 24, 2015

(30) Foreign Application Priority Data
Jul. 23, 2012    (JP) .................................. 2012-162736

(51) Int. Cl.
G01R 1/067    (2006.01)
G01R 31/00    (2006.01)
(Continued)

(52) U.S. Cl.
CPC ....... G01R 31/2884 (2013.01); G01R 1/0466 (2013.01); G01R 1/067 (2013.01); G01R 1/06722 (2013.01)

(58) Field of Classification Search
CPC .............. G01R 1/06722; G01R 1/0675; G01R 1/07371; G01R 31/2889; G01R 31/2896
(Continued)

(56) References Cited

U.S. PATENT DOCUMENTS 6,462,567 B1 * 10/2002 Vinther .............. G01R 1/06722
324/754.14
6,821,131 B2 * 11/2004 Suzuki ............... H01R 13/2421
439/700
(Continued)

FOREIGN PATENT DOCUMENTS

JP    2004-503750 A    2/2004
JP    2004-503783 A    2/2004
(Continued)

OTHER PUBLICATIONS

Jan. 27, 2015 International Preliminary Report on Patentability issued in International Patent Application No. PCT/JP2013/064358.

*Primary Examiner* — Giovanni Astacio-Oquendo
(74) *Attorney, Agent, or Firm* — Oliff PLC

(57) ABSTRACT

The invention provides a contact probe and a semiconductor element socket provided with the same, the contact probe capable of smooth inspection of a device while securing good conductivity. A contact probe has an upper plunger having a contact stem portion, a lower plunger having an insertion hole with which the contact stem portion is capable of coming into contact, and a coil spring connected to the upper plunger and the lower plunger in such a way as to cover the contact stem portion. The coil spring is configured by helically winding a wiring, and includes a guide portion wound tight in the axial direction of the coil spring by the wire, the guide portion located on the lower plunger side of the coil spring and also includes the upper plunger side portion than an upper end portion of the insertion hole.

5 Claims, 30 Drawing Sheets

(51) Int. Cl.
*G01R 31/28* (2006.01)
*G01R 1/04* (2006.01)

(58) Field of Classification Search
USPC ............. 324/755.08, 755.01, 755.05, 756.03
See application file for complete search history.

(56) References Cited

U.S. PATENT DOCUMENTS

| | | | | |
|---|---|---|---|---|
| 7,154,286 B1 * | 12/2006 | Marx | ................. | H01R 13/2421 |
| | | | | 324/755.05 |
| 7,253,647 B2 * | 8/2007 | Lee | ................... | G01R 1/06722 |
| | | | | 324/72.5 |
| 7,307,528 B2 * | 12/2007 | Glidden | ............. | G01R 31/3025 |
| | | | | 324/537 |
| 7,626,408 B1 * | 12/2009 | Kaashoek | .......... | G01R 1/06722 |
| | | | | 324/755.05 |
| 7,677,901 B1 * | 3/2010 | Suzuki | ................. | G01R 1/0466 |
| | | | | 439/66 |
| 7,862,391 B2 * | 1/2011 | Johnston | ............ | H01R 13/2421 |
| | | | | 439/66 |
| 9,059,545 B2 * | 6/2015 | Mason | ................. | H01R 12/714 |
| 2003/0137316 A1 | 7/2003 | Kazama | | |
| 2010/0123476 A1 | 5/2010 | Kazama et al. | | |
| 2010/0164518 A1 * | 7/2010 | Yamada | ............. | G01R 1/07314 |
| | | | | 324/756.03 |

FOREIGN PATENT DOCUMENTS

| | | |
|---|---|---|
| JP | 2010-157386 A | 7/2010 |
| WO | 02/04961 A2 | 1/2002 |
| WO | 2007/077784 A1 | 7/2007 |
| WO | 2008/133209 A1 | 11/2008 |
| WO | 2008/136396 A1 | 11/2008 |
| WO | 2013/061486 A1 | 5/2013 |

* cited by examiner

CONTACT PROBE AND SEMICONDUCTOR ELEMENT SOCKET PROVIDED WITH SAME

TECHNICAL FIELD

The present invention relates to a contact probe and a semiconductor element socket provided with the same.

BACKGROUND ART

Conventionally, there have been provided semiconductor element sockets in which contact probes are arranged as connecting elements to electrically connect a semiconductor element such as an IC (integrated circuit) package and an inspection circuit board of an inspection device. The connecting element has been known as a contact probe to be arranged in a semiconductor element socket of this type, the contact probe having a plunger with a contact tip end portion, a barrel with a cavity, and a spring provided between the plunger and the barrel, and configured to establish electrical continuity between the plunger and the barrel by inserting the contact tip end portion of the plunger into the cavity in the barrel and bringing the contact tip end portion into contact with an inner surface of the cavity (see PATENT DOCUMENT 1, for example).

PRIOR ART DOCUMENTS

Patent Documents

PATENT DOCUMENT 1: Japanese Patent Laid-Open No. 2004-503750

SUMMARY OF INVENTION

By the way, according to the contact probe described in PATENT DOCUMENT 1, it is necessary to provide the barrel with a deep cavity so that the contact tip end portion of the plunger can be surely engaged with the inner surface of the cavity. On the other hand, the contact probe is a fine part and a wall surface around the cavity of the barrel is small in thickness. In the contact probe being the fine part, it has been extremely difficult to form the barrel having the deep cavity with the thin wall surface at high accuracy by using a processing machine.

In addition, component parts of the contact probe are generally subjected to a surface treatment such as gold plating in order to secure good conductivity. However, it has been difficult to achieve uniform plating by circulating a plating solution inside the deep cavity in the barrel, and also to inspect a state of formation of the plating in a nondestructive manner. Particularly, a difficulty in uniformly plating the inner surface of the cavity in the barrel increases along with miniaturization of the contact probe.

Moreover, in the case of an internal contact structure like the above-described contact probe designed such that the contact tip end portion of the plunger inserted into the cavity in the barrel is brought into contact, the barrel and the plunger do not travel smoothly if the contact property therebetween is increased by reducing a clearance between the cavity and the contact tip end portion. On the other hand, the contact between the cavity and the contact tip end portion becomes unstable if the clearance between the cavity and the contact tip end portion is increased.

An object of the present invention is to provide a contact probe and a semiconductor element socket provided with the same. The contact probe can smoothly inspect a device while securing good conductivity.

A contact probe of the present invention capable of solving the problem comprising: a first plunger including a contact stem portion; a second plunger including a contact portion with which the contact stem portion is capable of coming into contact; and a coil spring connected to the first plunger and the second plunger in such a way as to cover the contact stem portion, wherein the coil spring is configured by helically winding a wiring, and is provided with a guide portion formed by the wiring wound tight in an axial direction of the coil spring, the guide portion located at a portion on the second plunger side of the coil spring and also includes the first plunger side portion of the coil spring than the contact portion.

In the contact probe of the present invention, it is preferable that the contact stem portion be slightly inserted into the guide portion when the first plunger and the second plunger do not come close to each other.

In the contact probe of the present invention, it is preferable that the guide portion have a tapered shape gradually narrowing toward the contact portion.

A semiconductor element socket of the present invention is characterized in that the semiconductor element socket includes any one of the above-described contact probes, and the contact probe brings an electrode portion of a semiconductor element and an electrode portion of an inspection board into conduction.

According to the present invention, when the first plunger and the second plunger come close to each other, a tip end portion of the contact stem portion of the first plunger comes close to and comes into contact with the contact portion. Here, even if the contact stem portion is displaced from the center of the contact portion, the contact stem portion is guided to the contact portion of the second plunger by the guide portion of the coil spring. Thus, the contact stem portion comes into contact with the contact portion, whereby the first plunger is surely brought the second plunger into conduction.

Additionally, unlike the contact probe having the structure including the deep cavity into which the contact tip end portion is to be inserted and with which the contact tip end portion is to be brought into contact, it is not necessary to form a deep guiding hole with a thin wall. Thus, the contact probe can be processed easily. Accordingly, it is possible to achieve miniaturization while securing sufficient strength, and moreover, to secure good conductivity at a contact portion by smoothly performing a plating process. Thus, production yield can be improved.

DESCRIPTION OF EMBODIMENTS

Embodiments of a contact probe and a semiconductor element socket provided with the same according to the present invention will be described below with reference to the drawings.

First Embodiment

A contact probe according to a first embodiment will be described to begin with.

Figure 1:
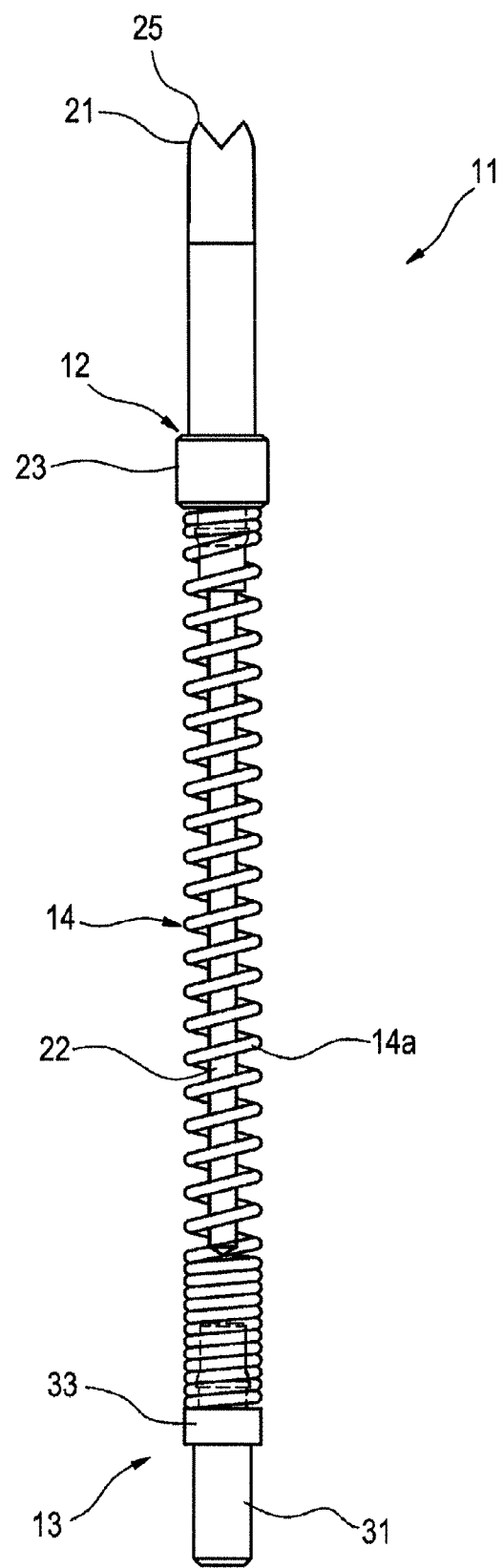
FIG. 1 is a side view of a contact probe according to a first embodiment of the present invention.

As shown in FIG. 1, a contact probe 11 according to the first embodiment has an upper plunger (an example of a first plunger) 12, a lower plunger (an example of a second plunger) 13, and a coil spring 14 provided between the upper plunger 12 and the lower plunger 13 and configured to connect the upper plunger 12 to the lower plunger 13.

Figure 2:
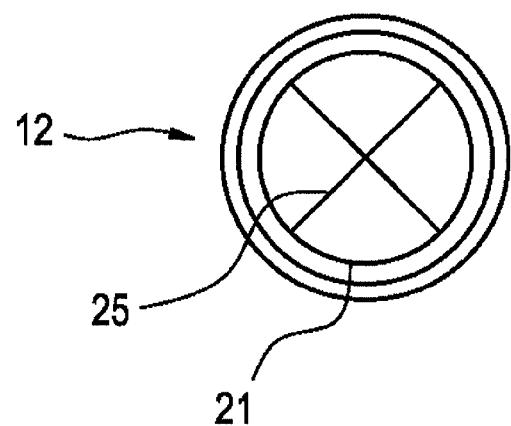
FIG. 2 is a top view of the contact probe according to the first embodiment.

The upper plunger 12 is formed of a conductive metal material, and an upper contact 21 is formed on an upper end side thereof as shown in FIG. 2. The upper contact 21 has a plurality of chevron peak portions 25. Moreover, the upper plunger 12 has a contact stem portion 22 that extends downward. Furthermore, the upper plunger 12 has a flange portion 23 extending outward therefrom, the flange located between an intermediate portion between the upper contact 21 and the contact stem portion 22.

Figure 3:
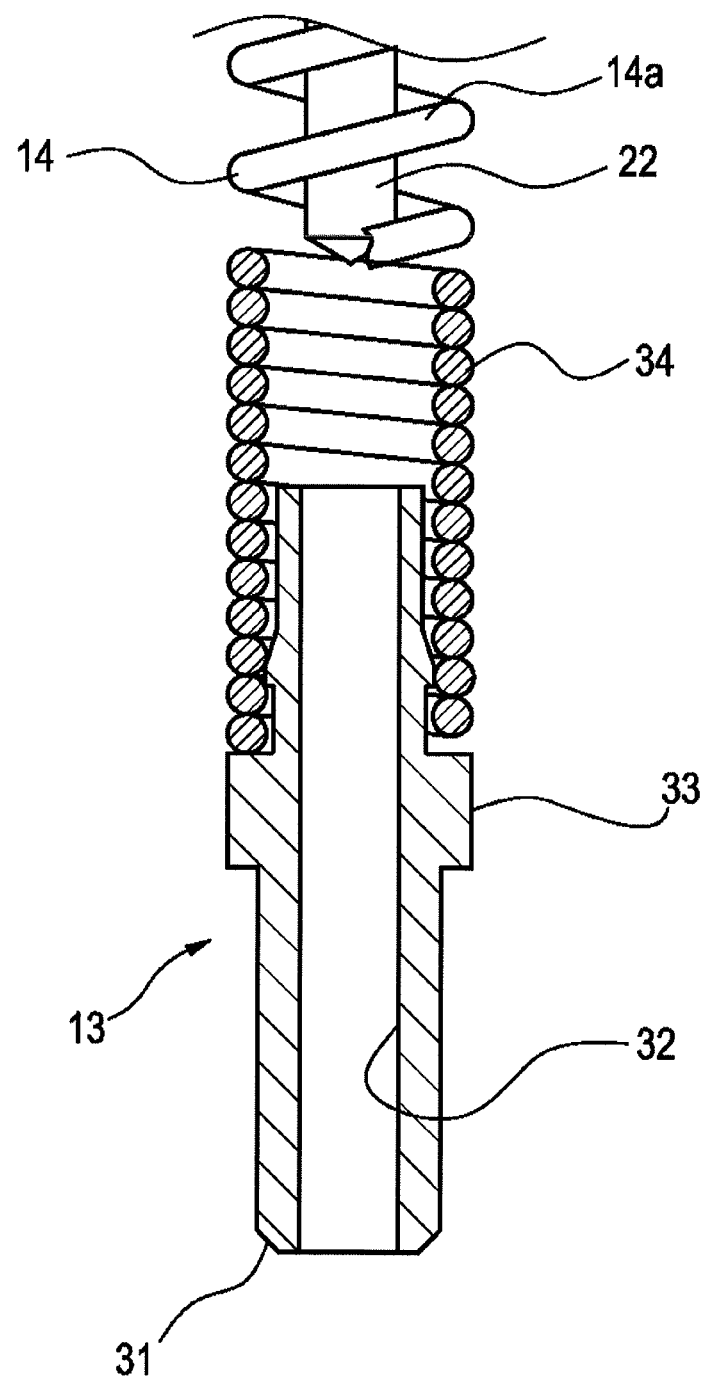
FIG. 3 is a partial cross-sectional view of a lower end of the contact probe according to the first embodiment.

The lower plunger 13 is formed of a conductive metal material, and a lower end side thereof is formed as a lower contact 31 as shown in FIG. 3. The lower plunger 13 is formed into a cylindrical shape provided with an insertion hole 32 (an example of a contact portion). When the upper plunger 12 and the lower plunger 13 come close to each other, the contact stem portion 22 of the upper plunger 12 is inserted into the insertion hole 32. Moreover, the lower plunger 13 has a flange portion 33 extending outward therefrom, the flange located at an intermediate portion thereof.

The upper plunger 12 and the lower plunger 13 are preferably subjected to a plating process such as gold plating in order to secure good conductivity at contact portions thereof.

The coil spring 14 is formed by helically winding a wire 14a made of spring steel. An upper end of the coil spring 14 is brought into contact with the flange portion 23 of the upper plunger 12 while a lower end thereof is brought into contact with the flange portion 33 of the lower plunger 13. The contact stem portion 22 of the upper plunger 12 is inserted into an inner side of the coil spring 14 from its upper end side in such a way to be covered by the coil spring 14. Meanwhile, an upper end side of the lower plunger 13 is inserted into the coil spring 14 from its lower end side in such a way as to be covered by the coil spring 14.

As shown in FIG. 3, the coil spring 14 has a guide portion 34 located on its lower end side and wound tight in the axial direction of the coil spring 14 by the wire 14a made of the spring steel. The upper end of the lower plunger 13 is inserted into the guide portion 34. The guide portion 34 projects from the upper end of the lower plunger 13 toward the upper plunger 12. A tip end portion of the contact stem portion 22 of the upper plunger 12 is located at a position slightly inserted into the guide portion 34 when the upper plunger 12 and the lower plunger 13 do not move closer to one another. In other words, the guide portion 34 is formed at a portion which is located on the lower plunger 13 side of the coil spring 14 and also includes the upper plunger 12 side portion than an upper end portion of the insertion hole 32.

Next, a semiconductor element socket having the plurality of contact probes 11 will be described.

Figure 4:
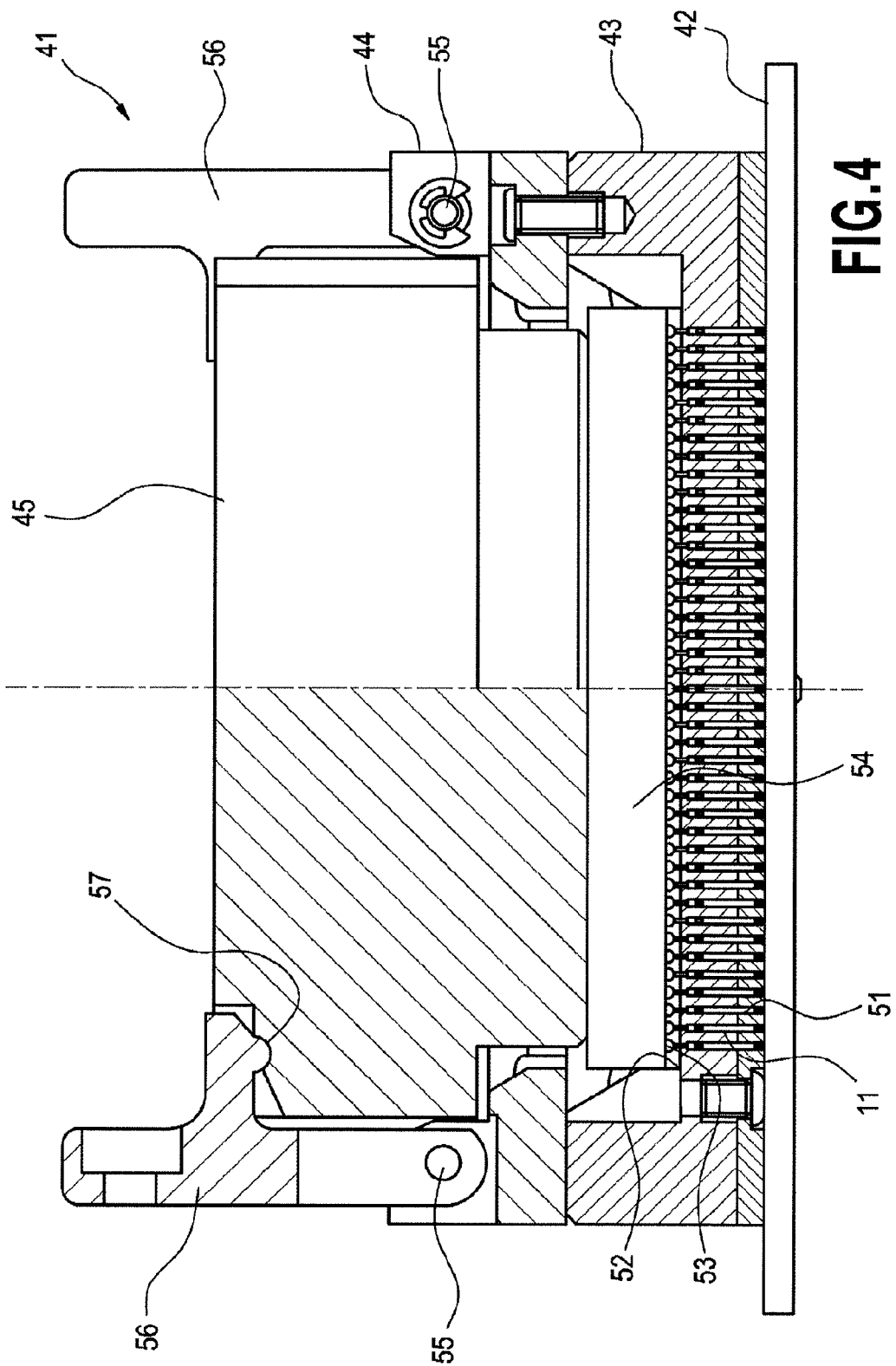
FIG. 4 is a cross-sectional view of a semiconductor element socket including the contact probes according to the first embodiment.

As shown in FIG. 4, a semiconductor element socket 41 fixed onto an inspection board 42 of an inspection device has a probe accommodating block 43, an detachable/attachable mechanism portion 44, and a pressing block 45. The inspection board 42 and the probe accommodating block 43 are fixed together in a stacked state, and the detachable/attachable mechanism portion 44 is fixed to an upper part of the probe accommodating block 43.

A plurality of probe accommodating holes 51 are formed in the probe accommodating block 43, and the contact probes 11 are respectively accommodated in the probe accommodating holes 51. On the inspection board 42, electrode portions (not shown) are provided at configuration positions of the lower contacts 31 of the contact probes 11 accommodated in the probe accommodating holes 51. The lower contacts 31 of the respective contact probes 11 are conductively brought into contact with the electrode portions.

A accommodating portion 52 is formed at a central part of the probe accommodating block 43. A semiconductor element 54 is accommodated into the accommodating portion 52 from an upper side, the semiconductor element including a plurality of electrode portions 53 made of solder balls provided on a lower surface side. Moreover, while the semiconductor element 54 is housed in the accommodating portion 52, the pressing block 45 is placed on the semiconductor element 54.

The detachable/attachable mechanism portion 44 has clamps 56 each of which is rotatable about a horizontal rotational movement shaft 55. A pressure projection 57 is formed on each clamp 56. Moreover, when the clamps 56 are rotationally moved toward the pressing block 45, the pressure projections 57 of the clamps 56 are engaged with the pressing block 45. Thus, the pressing block 45 is pressed down.

When the semiconductor element 54 is inspected with the semiconductor element socket 41 having the above-described structure, the semiconductor element 54 is accommodated into the accommodating portion 52 of the probe accommodating block 43. Then, the electrode portions 53 of the semiconductor element 54 are disposed on the contact probes 11.

In this state, the pressing block 45 is disposed on the semiconductor element 54, and then the pressing block 45 is pressed down by rotationally moving the clamps 56 of the detachable/attachable mechanism portion 44 toward the pressing block 45. Then, the semiconductor element 54 housed in the accommodating portion 52 is pressed and the electrode portions 53 come into contact with the upper contacts 21 of the upper plungers 12 of the contact probes 11. Hereby, the electrode portions 53 of the semiconductor element 54 are conductively connected to the electrode portions of the inspection board 42 through the contact probes 11, whereby the inspection of the semiconductor element 54 becomes possible.

Here, a description will be given of movement of each contact probe 11 when the corresponding electrode portion 53 of the semiconductor element 54 is pressed against the contact probe 11.

Figure 5A:
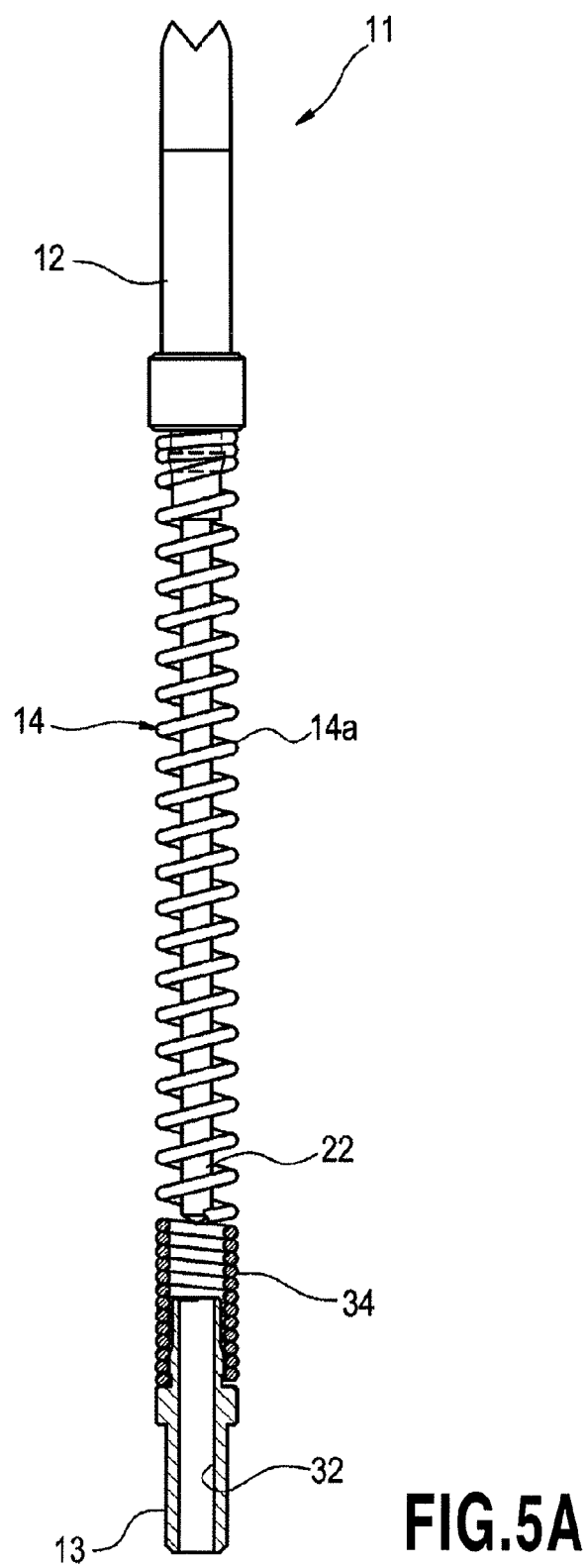
FIG. 5A is a view for explaining movement of the contact probe according to the first embodiment, which is a side view including a partial cross-sectional view of a main part.
Figure 5B:
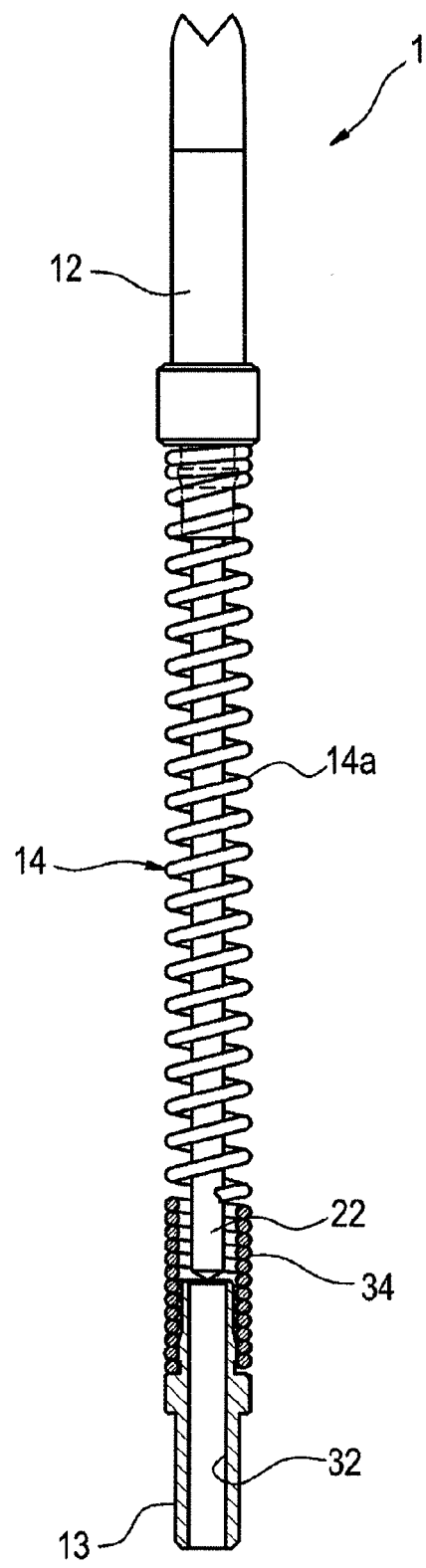
FIG. 5B is a view for explaining the movement of the contact probe according to the first embodiment, which is a side view including a partial cross-sectional view of the main part.

When the semiconductor element 54 is pressed down and each electrode portion 53 is pressed against the contact probe 11, the upper plunger 12 moves toward the lower plunger 13 while going against a biasing force of the coil spring 14. Hereby, as shown in FIG. 5A, from the state where the tip end portion of the contact stem portion 22 is slightly inserted into the guide portion 34 when the upper plunger 12 and the lower plunger 13 are not in contact, the tip end portion of the contact stem portion 22 enters the guide portion 34 along with the movement of the upper plunger 12 as shown in FIG. 5B. At this time, since the guide portion 34 is made of the portion wound tight in the axial direction by the wire 14a in the coil spring 14 made of the spring steel, the contact stem portion 22 is smoothly guided by the guide portion 34 toward the lower plunger 13.

Figure 5C:
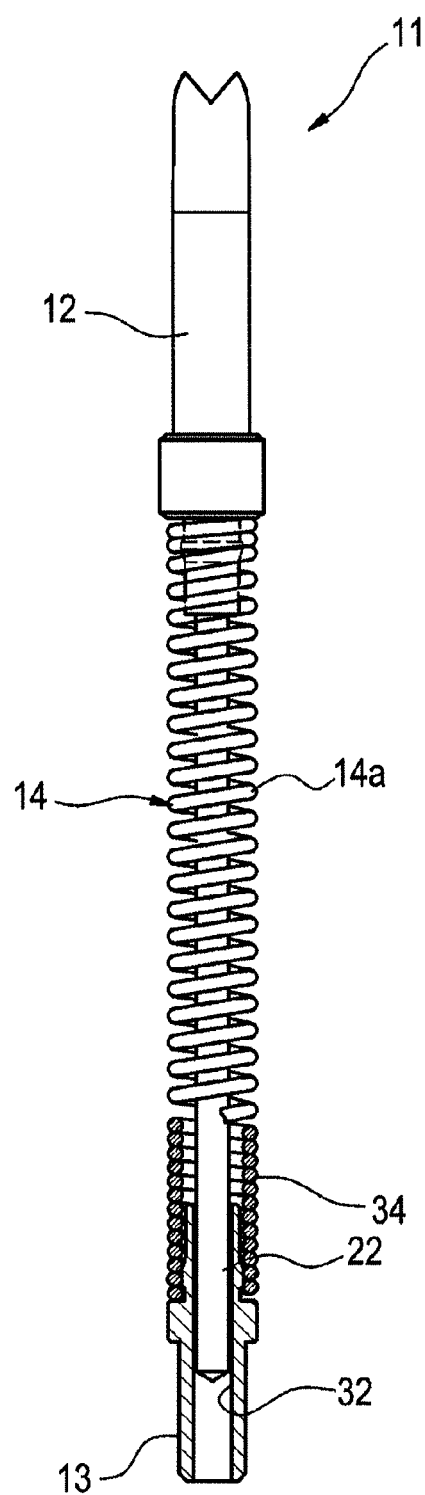
FIG. 5C is a view for explaining the movement of the contact probe according to the first embodiment, which is a side view including a partial cross-sectional view of the main part.

When the semiconductor element 54 is pressed further downward, the coil spring 14 is further compressed and the upper plunger 12 comes close to the lower plunger 13 as shown in FIG. 5C, whereby the contact stem portion 22 is inserted into the insertion hole 32 of the lower plunger 13. Further, even if the contact stem portion 22 is displaced from the center of the coil spring 14, the contact stem portion 22 is guided by the guide portion 34 and is inserted into the insertion hole 32. Herewith, the contact stem portion 22 of the upper plunger 12 slides on and comes into contact with an inner surface of the insertion hole 32 of the lower plunger 13, and the upper plunger 12 is surely brought the lower plunger 13 into conduction. Thus, each electrode portion 53 of the semiconductor element 54 is surely brought the corresponding electrode portion of the inspection board 42 into conduction through the contact probe 11.

When the semiconductor element 54 is detached from the semiconductor element socket 41 after the inspection is completed, the upper plunger 12 of the contact probe 11 which has been pressed in moves up by the biasing force of the coil spring 14, whereby the contact stem portion 22 of the upper plunger 12 is pulled out of the insertion hole 32 of the lower plunger 13.

So, according to the contact probe 11 of this embodiment, when the upper plunger 12 and the lower plunger 13 come close to each other, the tip end portion of the contact stem portion 22 of the upper plunger 12 enters the guide portion 34 of the coil spring 14, and is surely guided into the insertion hole 32 of the lower plunger 13 by the guide portion 34 even when the contact stem portion 22 is displaced from the center of the coil spring 14. Hereby, the contact stem portion 22 comes into contact with the inner surface of the insertion hole 32, whereby the upper plunger 12 is surely brought the lower plunger 13 into conduction.

A portion of the lower plunger 13 surrounded by the coil spring 14 (a thin wall portion projecting from the flange portion 33 toward the upper plunger 12) also has a wall surface with a small thickness and a small length as compared to the remaining portion thereof. Namely, the length of the thin wall portion is small as compared to the contact probe having the structure provided with the plunger having the deep cavity such that the contact tip end portion is inserted into the hole and brought into contact therewith. In other words, the guiding hole formed with the thin wall does not have to be formed deep. Thus, the contact probe can be processed easily. Accordingly, it is possible to achieve finer the plunger while securing sufficient strength. In addition, it is also possible to secure good conductivity at contact portions by smoothly performing a plating process, thereby achieving improvement in production yield.

Additionally, since the upper plunger 12 is surely brought the lower plunger 13 into conduction, it is possible to achieve the contact between the upper plunger 12 and the lower plunger 13 at low resistance, and also to reduce a rise in temperature when a large current is applied.

Moreover, the upper plunger 12 can be surely brought the lower plunger 13 into conduction without subjecting the coil spring 14 to thick plating. Hereby, it is possible to solve problems in the course of manufacturing such as entanglement and adhesion of the coil springs 14 caused by subjecting the coil springs 14 to the thick plating. Thus, production yield of the coil springs 14 can also be improved.

Additionally, because in the contact probe 11, the tip end portion of the contact stem portion 22 of the upper plunger 12 is slightly inserted into the guide portion 34, when the upper plunger 12 comes close to the lower plunger 13, it is possible to prevent a problem that the contact stem portion 22 comes into contact and gets stuck with a portion of the coil spring 14 other than the guide portion 34.

And then, according to the semiconductor element socket 41 having the contact probes 11, the electrode portions 53 of the semiconductor element 54 can be surely brought the electrode portions of the inspection board 42 into conduction through the contact probes 11. This makes it possible to inspect the semiconductor element 54 at high reliability.

Next, other embodiments of the contact probe according to the present invention will be described.

Second Embodiment

Figure 6:
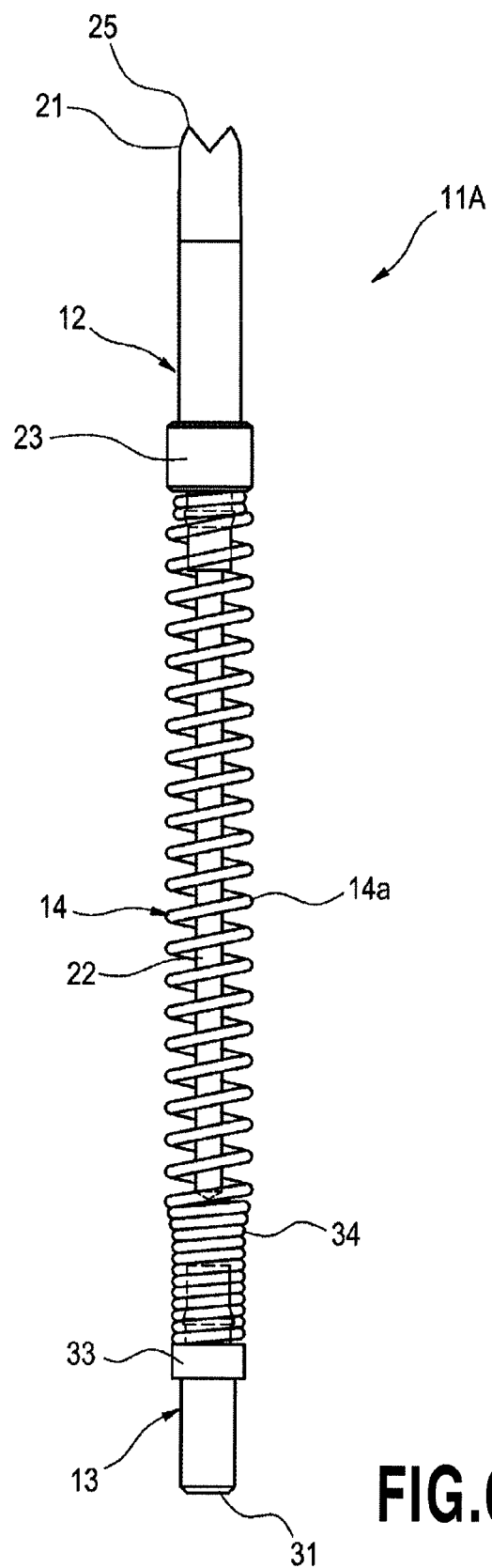
FIG. 6 is a side view of a contact probe according to a second embodiment.
Figure 7:
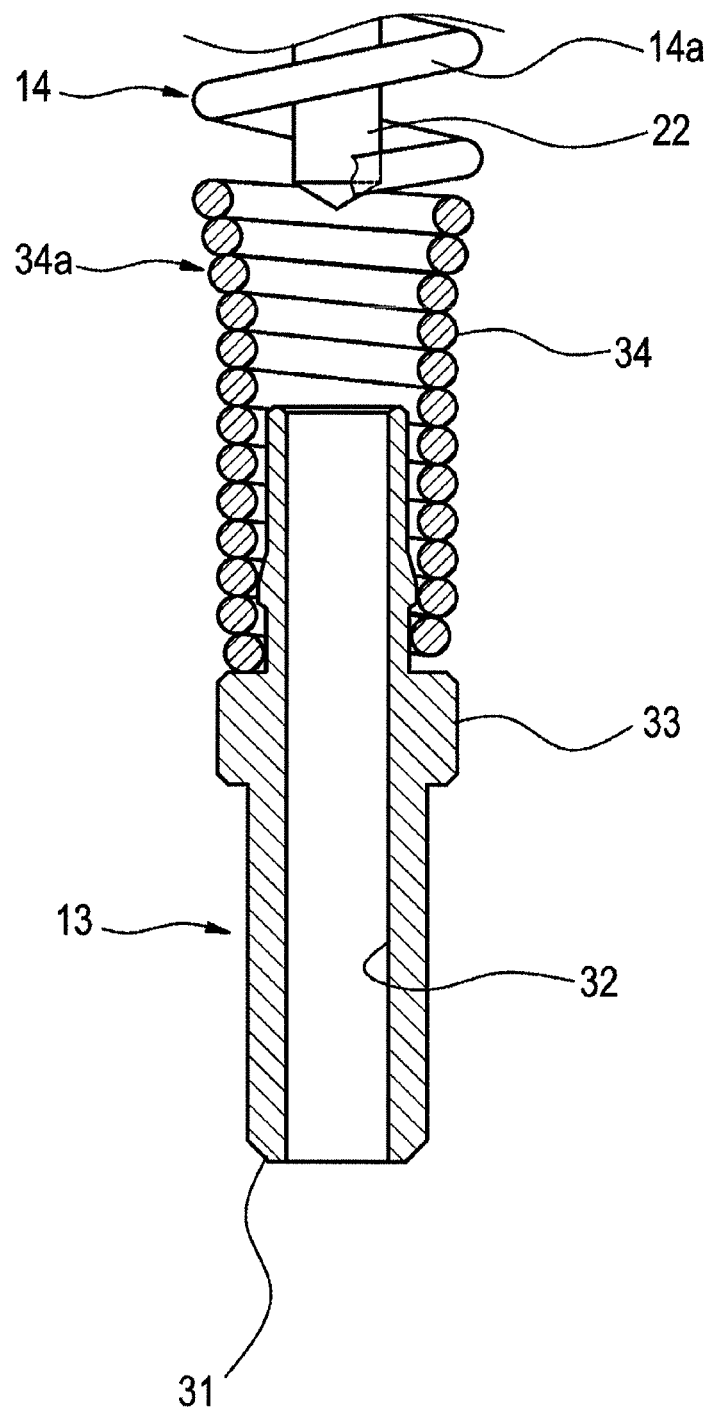
FIG. 7 is a cross-sectional view of a lower end of the contact probe according to the second embodiment.

As shown in FIG. 6 and FIG. 7, in a contact probe 11A of a second embodiment, the guide portion 34 of the coil spring 14 has a tapered portion 34a which gradually narrows toward the insertion hole 32 of the lower plunger 13.

According to the contact probe 11A having the guide portion 34 of such a shape, the contact stem portion 22 of the upper plunger 12 is more reliably guided to the insertion hole 32 of the lower plunger 13. Thus, it is possible to bring the upper plunger 12 and the lower plunger 13 into conduction more smoothly.

Third Embodiment

Figure 8:
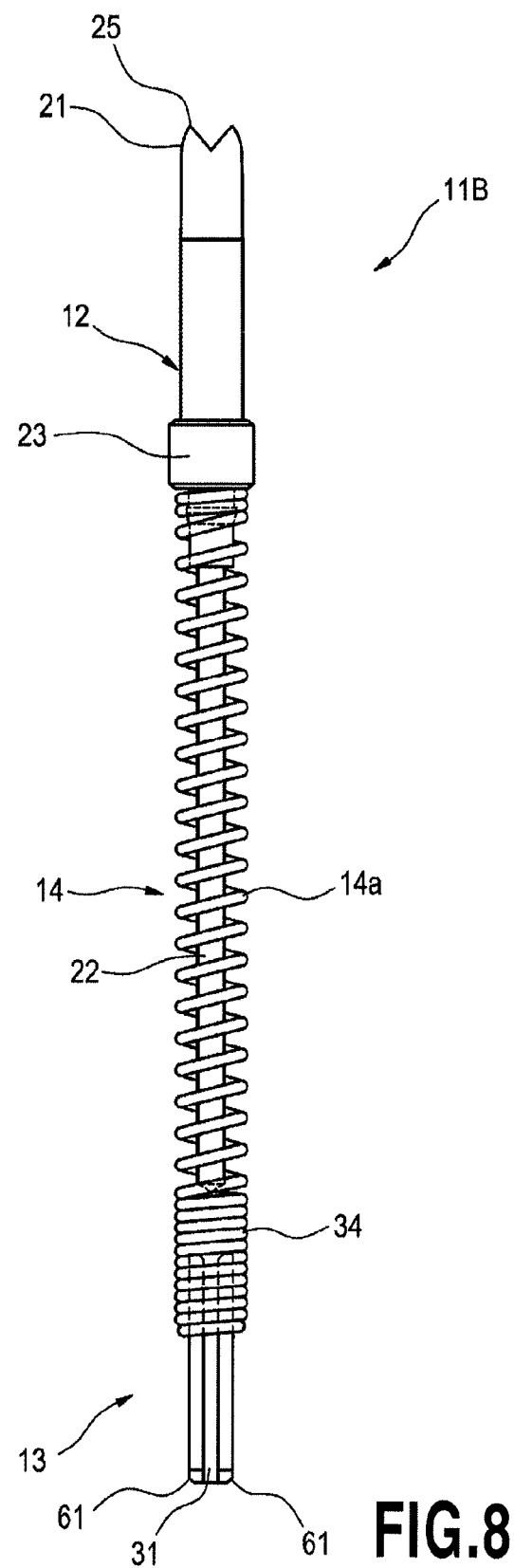
FIG. 8 is a side view of a contact probe according to a third embodiment.

As shown in FIG. 8, a contact probe 11B of a third embodiment has the lower plunger 13 formed to have a U-shaped cross section. The lower plunger 13 is formed by press work of a metal plate, and has plate-like portions (an example of the contact portion) 61 facing parallel to each other.

In the contact probe 11B, even when the contact stem portion 22 is displaced from the center of the coil spring 14, the contact stem portion 22 of the upper plunger 12 is guided by the guide portion 34, and enters a gap between the plate-like portions 61 of the lower plunger 13. Hereby, the contact stem portion 22 comes into contact with and is brought the plate-like portions 61 into conduction. According to the contact probe 11B, it is possible to cut down on the costs by forming the lower plunger 13 by the press work which requires a low manufacturing cost as compared to machining.

Fourth Embodiment

Figure 9A:
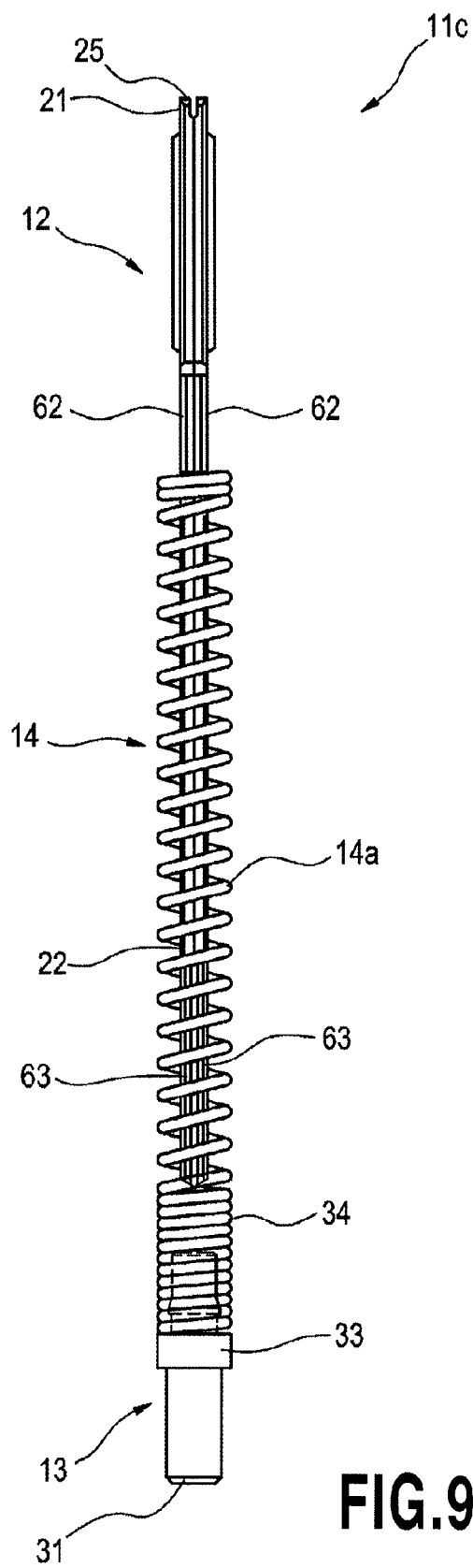
FIG. 9A is a front view showing a contact probe according to a fourth embodiment.
Figure 9B:
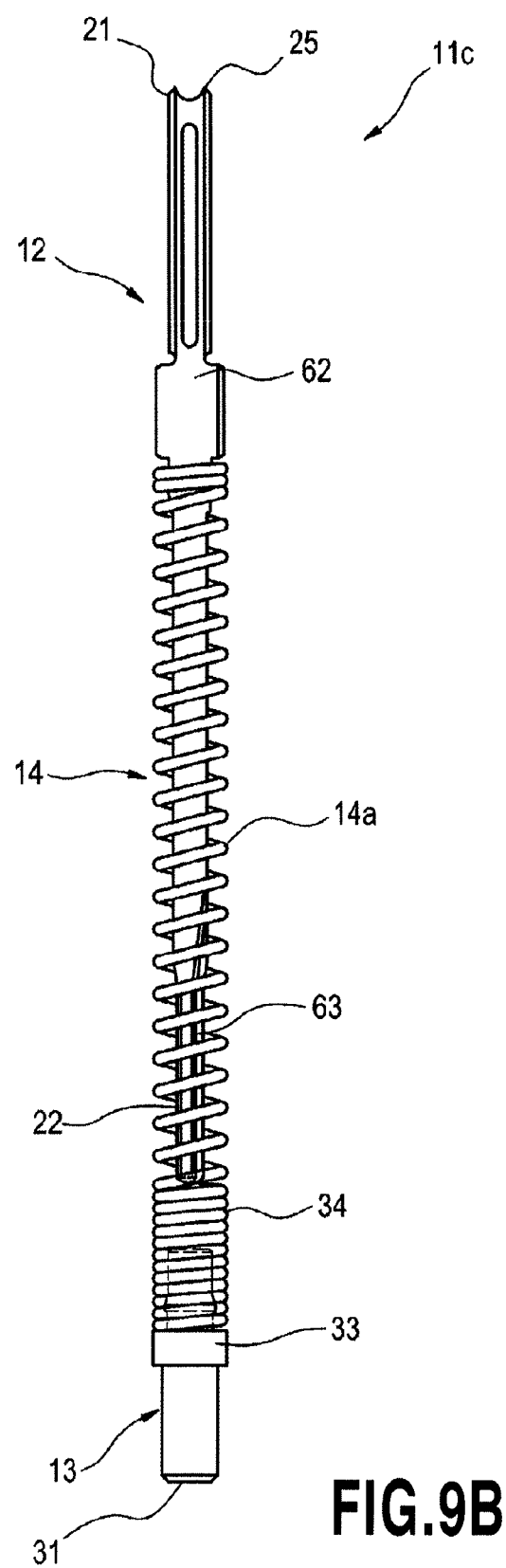
FIG. 9B is a side view showing the contact probe according to the fourth embodiment.
Figure 10:
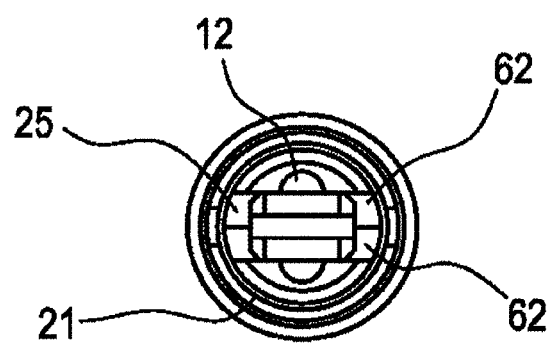
FIG. 10 is a top view of the contact probe according to the fourth embodiment.

As shown in FIGS. 9A and 9B, in a contact probe 11C of a fourth embodiment, the upper plunger 12 is configured by a pair of plate portions 62 overlapped with each other. The plate portions 62 are formed by bending a metal sheet in half, thereby being connected at a bent portion and overlapped with each other. And then, as shown in FIG. 10, in the upper plunger 12, the chevron peak portions 25 are formed at upper ends of the plate portions 62. Hereby, the upper contact 21 having the chevron peak portions 25 of the plate portions 62 is provided at the upper end of the upper plunger 12.

Figure 11:
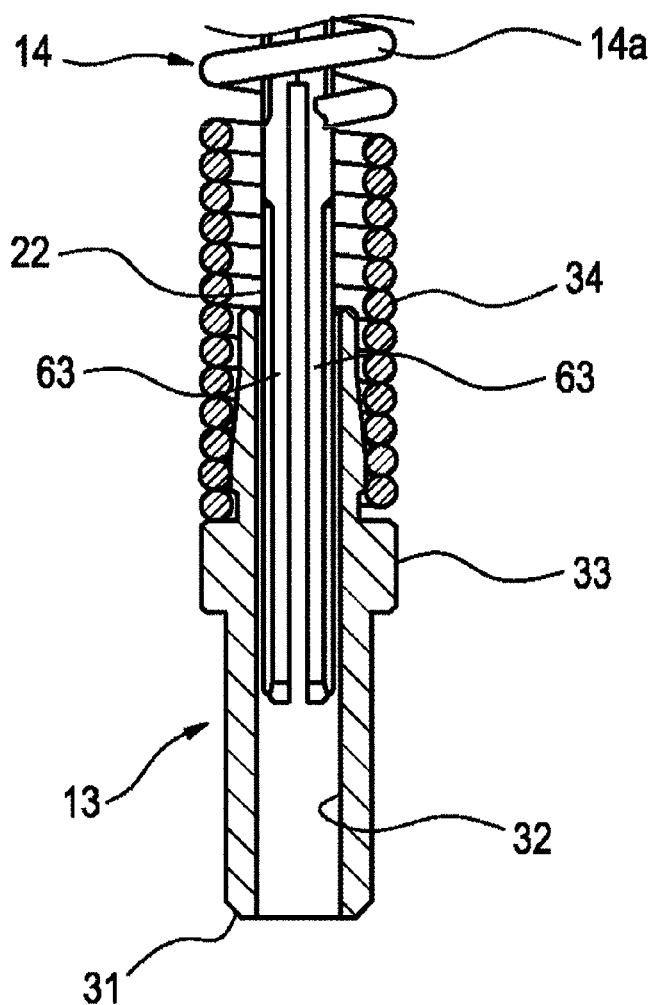
FIG. 11 is a cross-sectional view of a lower end of the contact probe according to the fourth embodiment.
Figure 12:
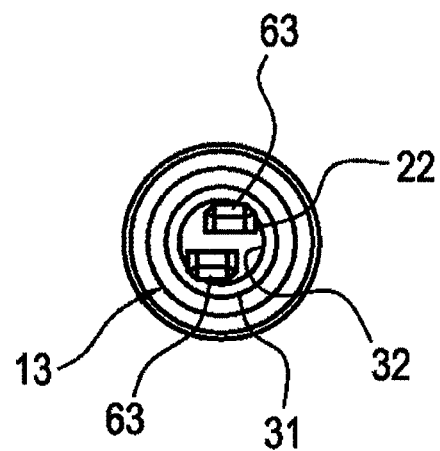
FIG. 12 is a bottom view of the contact probe according to the fourth embodiment.

As shown in FIG. 11 and FIG. 12, sticks 63 are formed on the lower plunger 12 side of the respective plate portions 62 constituting the upper plunger 12. The contact stem portion 22 is comprised from the sticks 63. The contact stem portion 22 consisted of the sticks 63 has an outside diameter such that a circumscribed circle of a cross section of the two sticks 63 has the outside diameter which is greater than an inside diameter of the insertion hole 32 of the lower plunger 13.

Figure 13A:
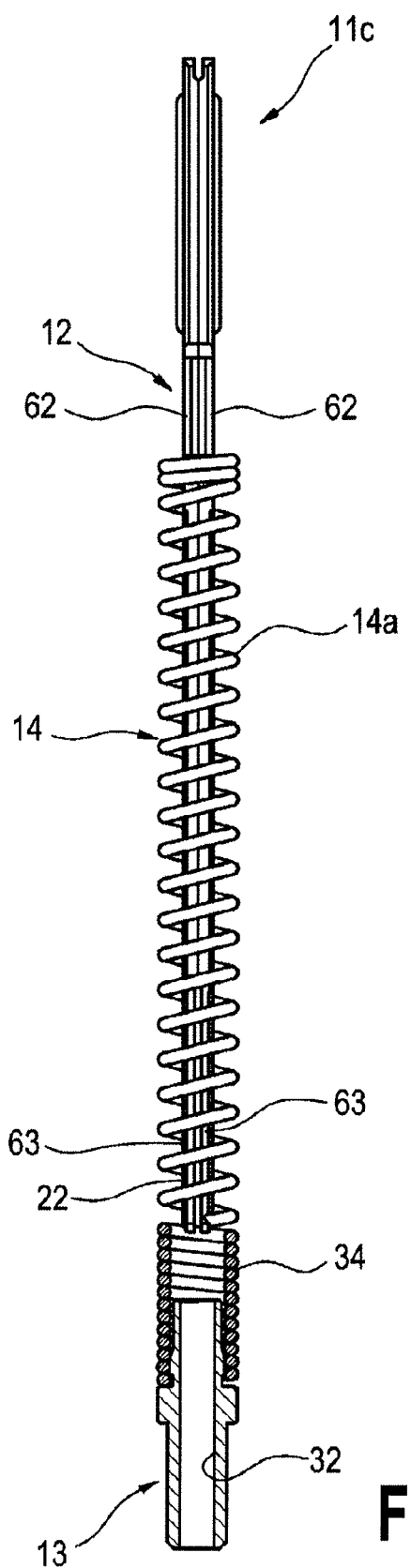
FIG. 13A is a view for explaining movement of the contact probe according to the fourth embodiment, which is a front view including a partial cross-sectional view of a main part.
Figure 13B:
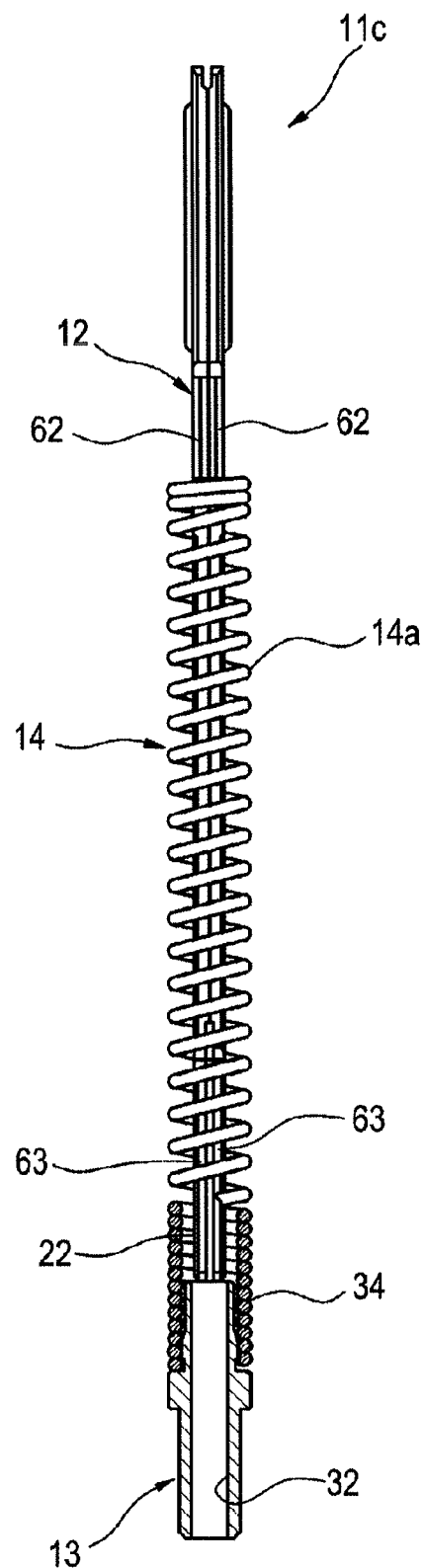
FIG. 13B is a view for explaining the movement of the contact probe according to the fourth embodiment, which is a front view including a partial cross-sectional view of the main part.
Figure 13C:
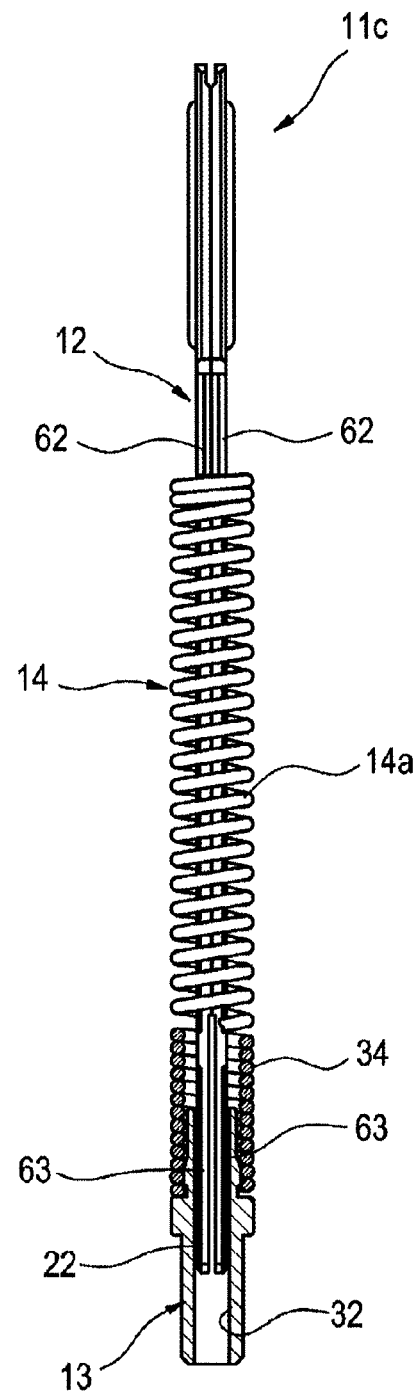
FIG. 13C is a view for explaining the movement of the contact probe according to the fourth embodiment, which is a front view including a partial cross-sectional view of the main part.
Figure 14A:
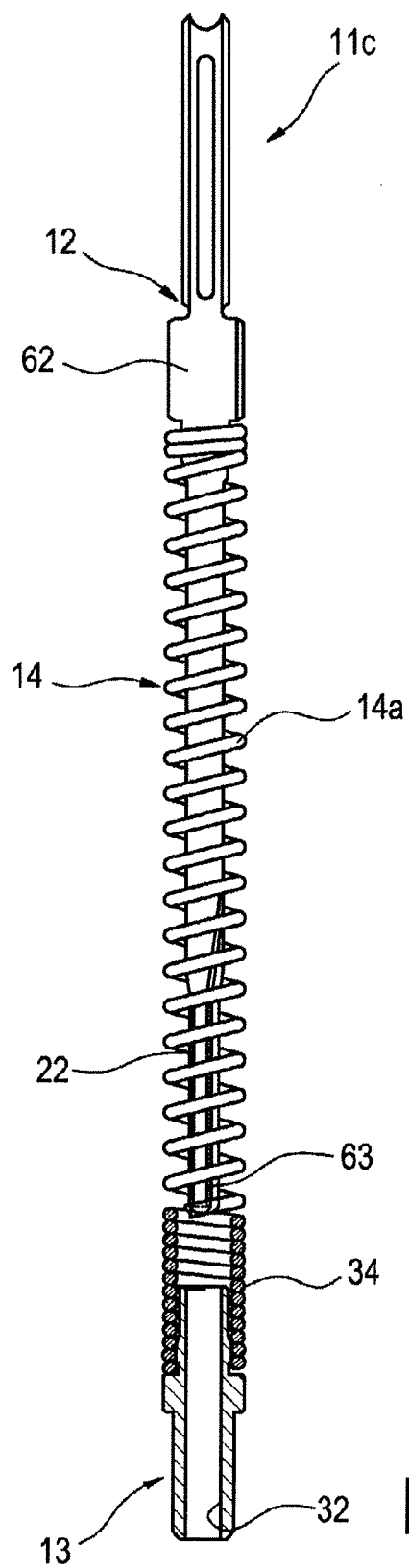
FIG. 14A is a view for explaining the movement of the contact probe according to the fourth embodiment, which is a side view including a partial cross-sectional view of the main part.
Figure 14B:
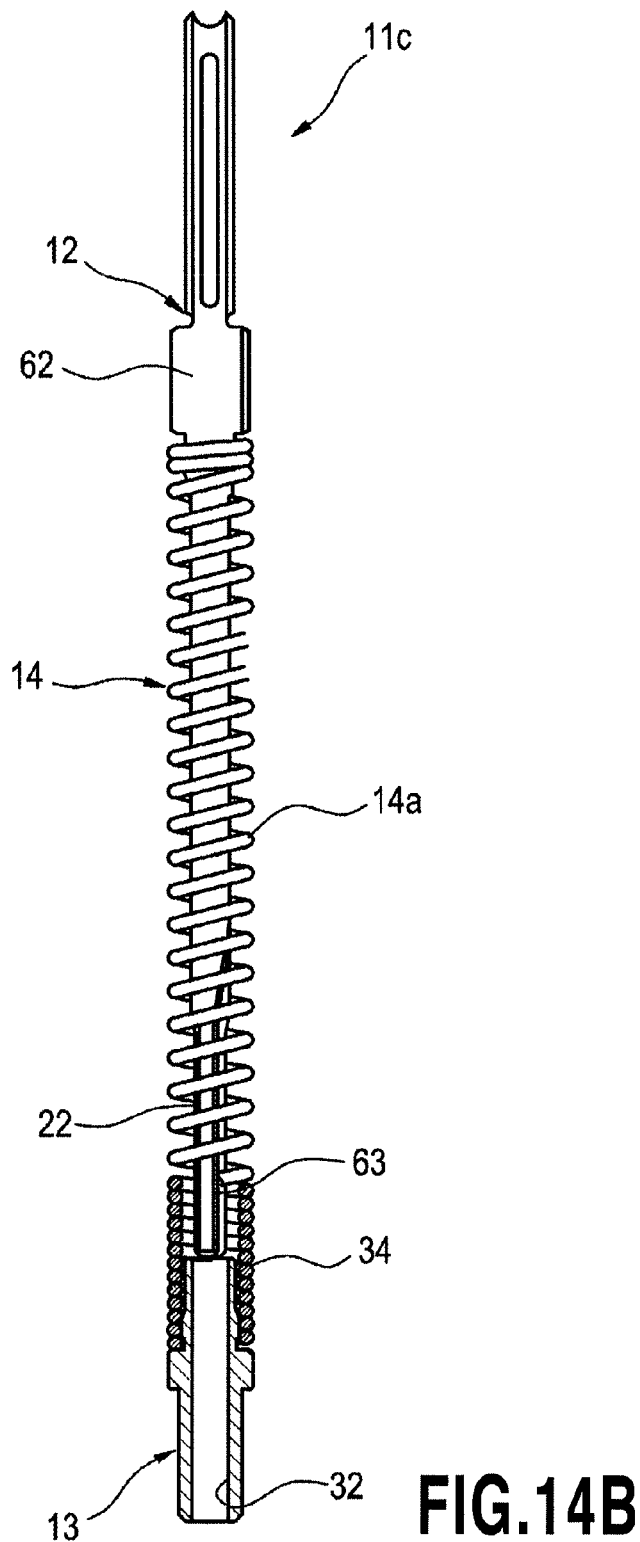
FIG. 14B is a view for explaining the movement of the contact probe according to the fourth embodiment, which is a side view including a partial cross-sectional view of the main part.
Figure 14C:
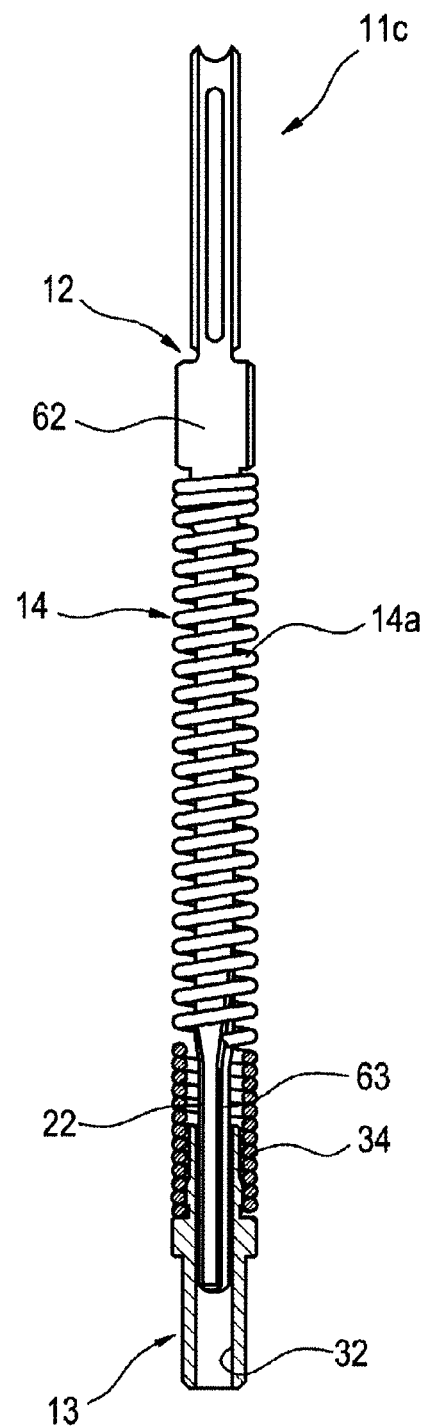
FIG. 14C is a view for explaining the movement of the contact probe according to the fourth embodiment, which is a side view including a partial cross-sectional view of the main part.

According to the contact probe 11C having such upper plunger 12, when the upper plunger 12 is pressed down, the tip end portion of the contact stem portion 22 consisted of the pair of sticks 63, which is in the state as shown in FIG. 13A and FIG. 14A where the tip end portion is slightly inserted into the guide portion 34, enters the guide portion 34 as shown in FIG. 13B and FIG. 14B. Thereafter, as shown in FIG. 13C and FIG. 14C, even if the contact stem portion 22 is displaced from the center of the coil spring 14, the contact stem portion 22 consisted of the pair of sticks 63 is guided by the guided portion 34 and is inserted into the insertion hole 32 of the lower plunger 13. Hereby, the respective sticks 63 of the contact stem portion 22 come into contact with the inner surface of the insertion hole 32, and the upper plunger 12 is brought the lower plunger 13 into conduction.

Moreover, the contact stem portion 22 consisted of the pair of sticks 63 has an outside diameter such that the circumscribed circle of the cross section of the pair of sticks 63 has the outside diameter greater than the inside diameter of the insertion hole 32 of the lower plunger 13. Accordingly, as the contact stem portion 22 enters the insertion hole 32, the sticks 63 are pressed and elastically deformed toward the center of the contact stem portion 22 by the inner surface of the insertion hole 32. Hereby, the contact stem portion 22 inserted into the insertion hole 32 is pressed against the inner surface of the insertion hole 32 by a restoring force of the elastically deformed sticks 63. Therefore, it is possible to achieve an extremely favorable state of conduction and to suppress resistance stably.

Fifth Embodiment

Figure 15A:
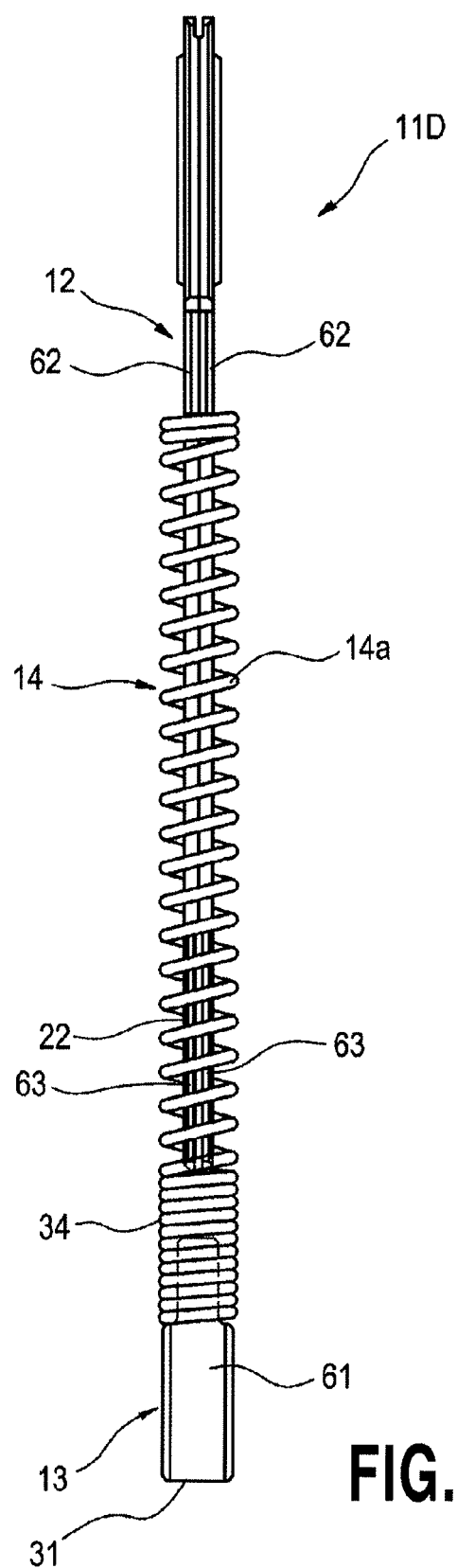
FIG. 15A is a front view showing a contact probe according to a fifth embodiment.
Figure 15B:
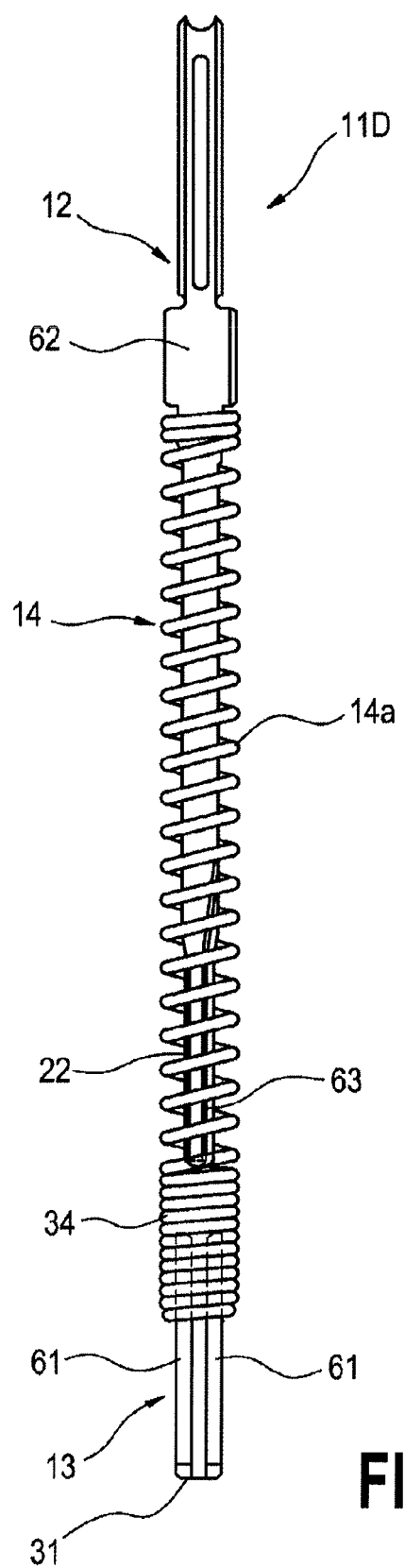
FIG. 15B is a side view showing the contact probe according to the fifth embodiment.

As shown in FIGS. 15A and 15B, a contact probe 11D of a fifth embodiment has the upper plunger 12 consisted of the pair of plate portions 62 overlapped with each other. The upper plunger 12 has the contact stem portion 22 consisted of the sticks 63 provided to the respective plate portions 62. In addition, the contact probe 11D has the lower plunger 13 formed to have the U-shaped cross section, in which the plate-like portions 61 face parallel to each other. The plate-like portions 61 of the lower plunger 13 are arranged in a direction orthogonal to the stacking direction of the plate portions 62 of the upper plunger 12.

According to the contact probe 11D, the contact stem portion 22 consisted of the pair of sticks 63 of the upper plunger 12 enters the gap between the plate-like portions 61 of the lower plunger 13. Hereby, the contact stem portion 22 comes into contact with and is brought the plate-like portions 61 into conduction.

Additionally, the contact stem portion 22 consisted of the pair of sticks 63 has an outside diameter such that the circumscribed circle of the cross section of the two sticks 63 has the outside diameter which is greater than the gap between the plate-like portions 61 of the lower plunger 13.

Figure 16A:
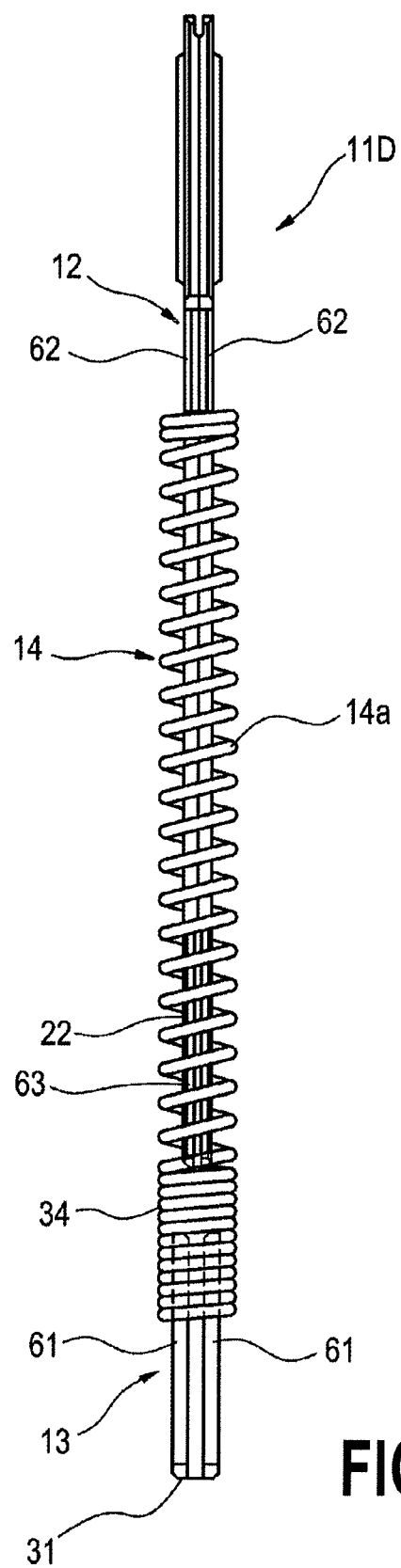
FIG. 16A is a front view showing the other example of the contact probe according to the fifth embodiment.
Figure 16B:
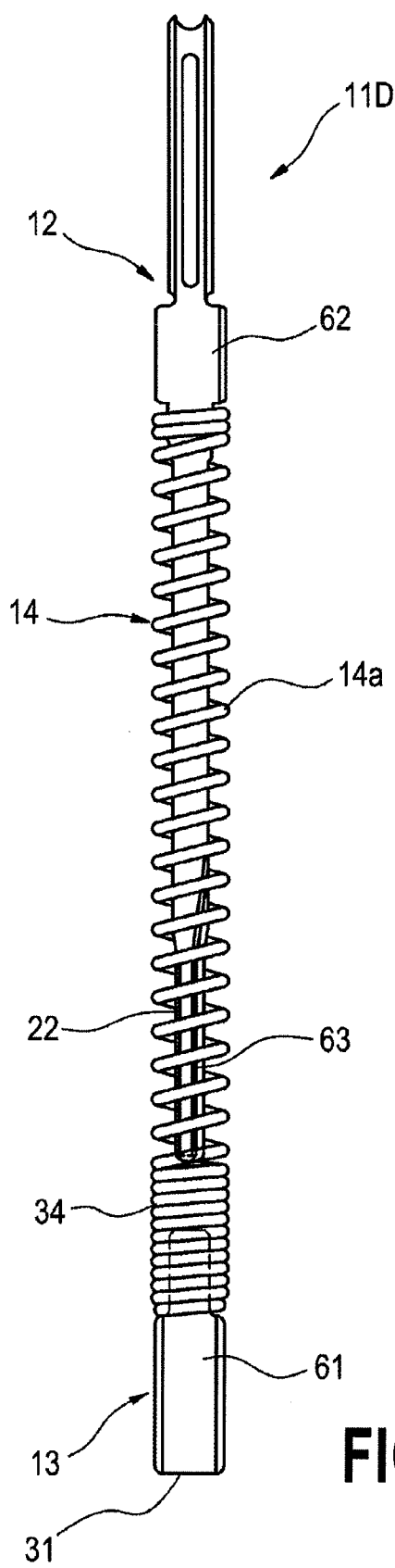
FIG. 16B is a side view showing the other example of the contact probe according to the fifth embodiment.

Accordingly, as the contact stem portion 22 enters the gap between the plate-like portions 61, the sticks 63 are pressed and elastically deformed toward the center of the contact stem portion 22 by inner surfaces of the plate-like portions 61. Therefore, the contact stem portion 22 inserted into the gap between the plate-like portions 61 is pressed against the inner surfaces of the plate-like portions 61 by the restoring force of the elastically deformed sticks 63. As a consequence, it is possible to achieve an extremely favorable state of conduction and to suppress resistance stably. Incidentally, as shown in FIGS. 16A and 16B, the plate-like portions 61 of the lower plunger 13 may be arranged along the stacking direction of the plate portions 62 of the upper plunger 12.

Sixth Embodiment

Figure 17A:
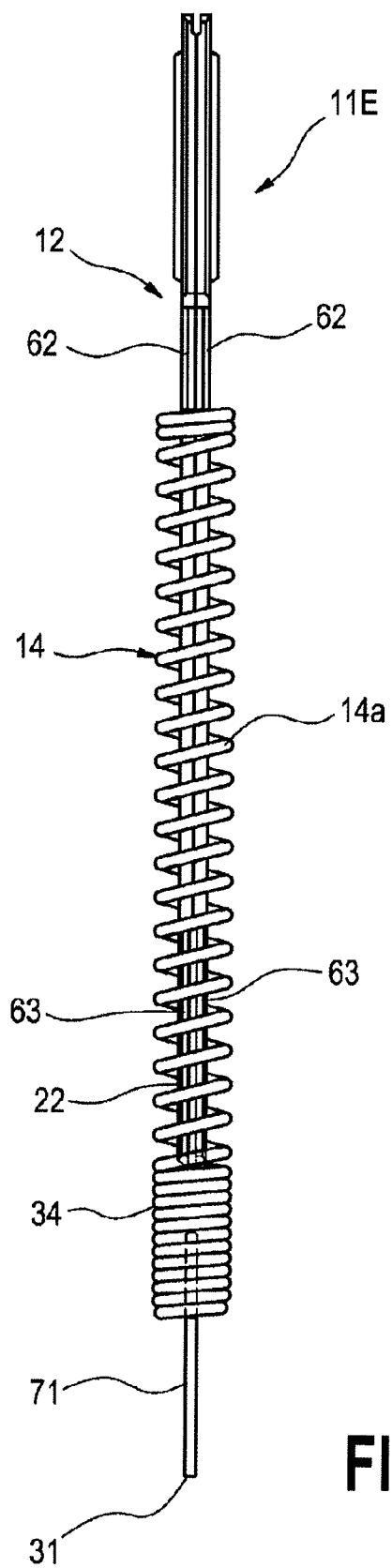
FIG. 17A is a front view showing a contact probe according to a sixth embodiment.
Figure 17B:
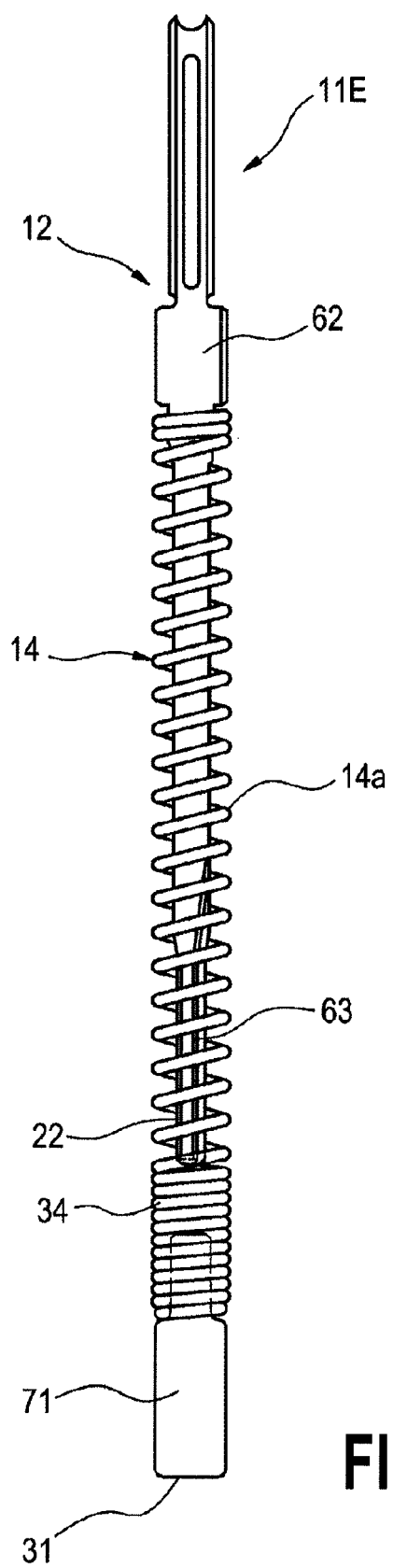
FIG. 17B is a side view showing the contact probe according to the sixth embodiment.

As shown in FIGS. 17A and 17B, a contact probe 11E of a sixth embodiment has the upper plunger 12 consisted of the pair of plate portions 62 overlapped with each other. The upper plunger 12 has the contact stem portion 22 consisted of the sticks 63 formed to the respective plate portions 62. In addition, the contact probe 11E has the lower plunger 13 provided with a single plate-like portion (an example of the contact portion) 71. The plate-like portion 71 is arranged in the direction orthogonal to the stacking direction of the plate portions 62 of the upper plunger 12.

In the contact probe 11E, when the contact stem portion 22 of the upper plunger 12 consisted of the pair of sticks 63 is guided to the lower plunger 13 by the guide portion 34, the plate-like portion 71 of the lower plunger 13 is inserted into the gap between the plate-like portions 61 constituting the contact stem portion 22 of the upper plunger 12. Hereby, the contact stem portion 22 comes into contact with and is brought the plate-like portion 71 into conduction.

In addition, a gap between the pair of sticks 63 constituting the contact stem portion 22 is made smaller than the thickness of the plate-like portion 71. Accordingly, as the plate-like portion 71 enters the gap between the sticks 63 of the contact stem portion 22, the sticks 63 are pressed and elastically deformed oppositely from the center of the contact stem portion 22 by an outer surface of the plate-like body 71. Hereby, the sticks 63 are pressed against the outer surface of the plate-like portion 71 by the restoring force of the elastically deformed sticks 63. Therefore, it is possible to achieve an extremely favorable state of conduction and to suppress resistance stably. Incidentally, the gap between the pair of sticks 63 constituting the contact stem portion 22 may be made smaller than the width of the plate-like portion 71 instead.

Seventh Embodiment

Figure 18A:
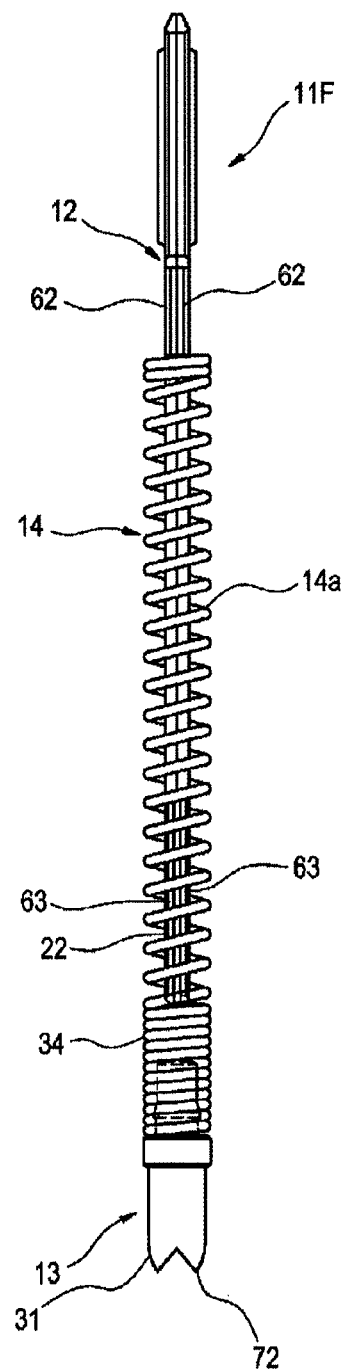
FIG. 18A is a front view showing a contact probe according to a seventh embodiment.
Figure 18B:
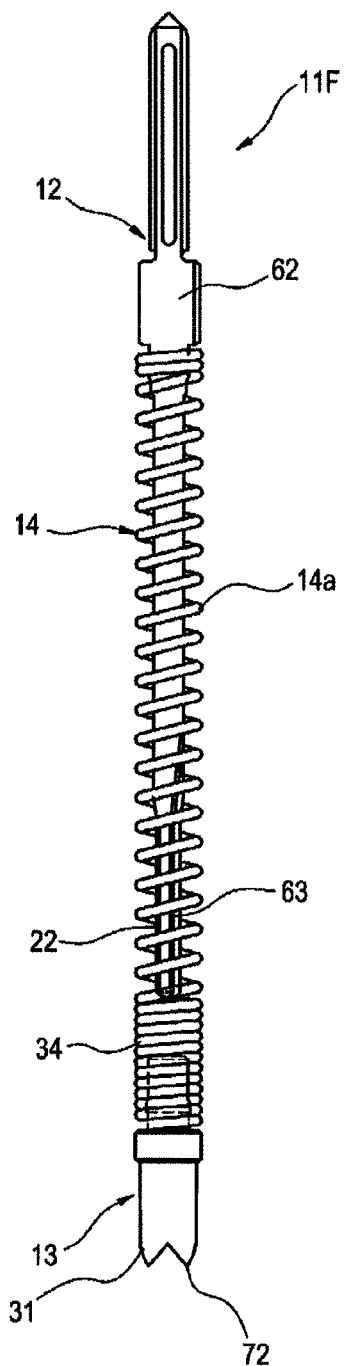
FIG. 18B is a side view showing the contact probe according to the seventh embodiment.
Figure 19:
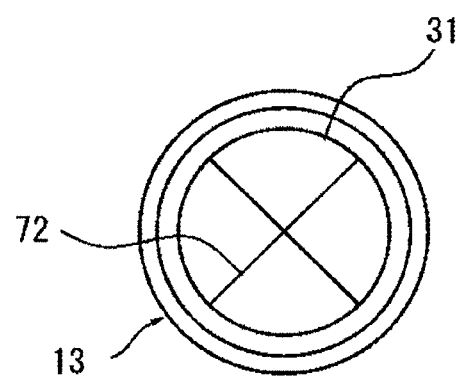
FIG. 19 is a bottom view of the contact probe according to the seventh embodiment.

As shown in FIGS. 18A and 18B, a contact probe 11F of a seventh embodiment has the upper plunger 12 consisted of the pair of plate portions 62 overlapped with each other. The upper plunger 12 has the contact stem portion 22 consisted of the sticks 63 formed to the respective plate portions 62. In addition, the contact probe 11F has the lower plunger 13 provided with the insertion hole 32. As shown in FIG. 19, chevron peak portions 72 are formed at a lower end of the lower plunger 13. Hereby, the lower contact 31 having the chevron peak portions 72 is provided at the lower end of the lower plunger 13.

According to the contact probe 11F, the peak portions 72 of the lower contact 31 are jammed into the corresponding electrode portion of the inspection board 42. Therefore, it is possible to achieve a reliable state of conduction between the lower plunger 13 and the electrode portion of the inspection board 42.

The present invention is not limited to the examples shown in the foregoing embodiments but can be modified as appropriate within the range not departing from the gist of the present invention.

REFERENCE SIGNS LIST 11, 11A, 11B, 11C, 11D, 11E, 11F: contact probe,
12: upper plunger (example of first plunger),
13: lower plunger (example of second plunger),
14: coil spring,
14a: wire,
22: contact stem portion,
32: insertion hole (example of contact portion),
34: guide portion,
41: semiconductor element socket,
42: inspection board,
53: electrode portion,
54: semiconductor element,
61, 71: plate-like portion (example of contact portion),
63: stick

The invention claimed is:

1. A contact probe comprising:
a first plunger having a contact stem portion;
a second plunger having a contact portion with which the contact stem portion is capable of coming into contact; and
a coil spring connected to the first plunger and the second plunger in such a way as to cover the contact stem portion, wherein
the coil spring is configured by helically winding a wiring and is provided with a guide portion formed by the wiring wound tight in an axial direction of the coil spring, the guide portion being located at a portion on the second plunger side of the coil spring and including the first plunger side portion of the coil spring other than the guide portion, and the guide portion guides the contact stem portion such that the contact stem portion is inserted into a hole of the second plunger when the first plunger comes close to the second plunger,
the hole of the second plunger is a round hole, and the wiring forming the guide portion is wound around an exterior portion of the second plunger that includes the hole,
the contact stem portion is slightly inserted into the guide portion when the first plunger and the second plunger do not come close to each other, and
the contact stem portion is inserted into the hole of the second plunger when the upper plunger and the lower plunger come close to each other.

2. The contact probe according to claim 1, wherein the guide portion has a tapered shape gradually narrowing toward the contact portion.

3. A semiconductor element socket provided with the contact probe as claimed in claim 2, wherein the contact probe brings an electrode portion of a semiconductor element and an electrode portion of an inspection board into conduction.

4. A semiconductor element socket provided with the contact probe as claimed in claim 1, wherein the contact probe brings an electrode portion of a semiconductor element and an electrode portion of an inspection board into conduction.

5. The contact probe according to claim 1, wherein an upper end of the second plunger is inserted in to the guide portion.

\* \* \* \* \*